(12) United States Patent
Kawaguchi

(10) Patent No.: US 9,609,793 B2
(45) Date of Patent: Mar. 28, 2017

(54) ELECTROMAGNETIC SHIELDING FILM, FLEXIBLE PRINTED WIRING BOARD WITH ELECTROMAGNETIC SHIELDING FILM, ELECTRONIC DEVICE AND METHOD FOR FORMING THE SAME

(71) Applicant: Shin-Etsu Polymer Co., Ltd., Tokyo (JP)

(72) Inventor: Toshiyuki Kawaguchi, Saitama (JP)

(73) Assignee: SHIN-ETSU POLYMER CO., LTD. (JP)

( * ) Notice: Subject to any disclaimer, the term of this patent is extended or adjusted under 35 U.S.C. 154(b) by 260 days.

(21) Appl. No.: 14/318,962

(22) Filed: Jun. 30, 2014

(65) Prior Publication Data

US 2015/0009637 A1    Jan. 8, 2015

(30) Foreign Application Priority Data

Jul. 3, 2013   (JP) .................................. 2013-139991

(51) Int. Cl.
| | |
|---|---|
| *H05K 9/00* | (2006.01) |
| *H05K 1/02* | (2006.01) |
| *H05K 1/03* | (2006.01) |

(52) U.S. Cl.
CPC ......... *H05K 9/0088* (2013.01); *H05K 1/0216* (2013.01); *H05K 1/0393* (2013.01); *Y10T 156/10* (2015.01)

(58) Field of Classification Search
CPC .. H05K 9/00; H05K 3/00; H05K 1/02; H05K 9/0088; H05K 3/0058; H05K 1/028
USPC ......................................................... 361/751
See application file for complete search history.

(56) References Cited

U.S. PATENT DOCUMENTS

| | | | | |
|---|---|---|---|---|
| 2002/0197771 | A1* | 12/2002 | Dotta ................... | H01L 21/563 438/114 |
| 2011/0101265 | A1* | 5/2011 | Kambara ............... | B01J 23/002 252/74 |
| 2012/0126381 | A1* | 5/2012 | Uenda ................... | C09J 7/0292 257/659 |
| 2013/0300618 | A1* | 11/2013 | Yarga .................... | H01Q 1/243 343/720 |

FOREIGN PATENT DOCUMENTS

| | | |
|---|---|---|
| CN | 102317383 A | 1/2012 |
| CN | 102378479 A | 3/2012 |

(Continued)

OTHER PUBLICATIONS

Office Action dated Apr. 26, 2016 issued in corresponding Japanese Patent Application No. 2013-139991 with English translation.

(Continued)

*Primary Examiner* — Eric Thomas
*Assistant Examiner* — Michael P McFadden
(74) *Attorney, Agent, or Firm* — Ostrolenk Faber LLP

(57) ABSTRACT

A electromagnetic shielding film includes a conductive supporting substrate which includes a cured material of a thermosetting resin including a conductive filler; a metal thin film layer which covers one surface of the conductive supporting substrate; a thermosetting adhesive layer which covers a surface of the metal thin film layer; and a peeling substrate which covers the other surface of the conductive supporting substrate.

9 Claims, 9 Drawing Sheets

(56) References Cited

FOREIGN PATENT DOCUMENTS

| CN | 102711428 A | 10/2012 |
|----|-------------|---------|
| JP | 58-101499 | 6/1983 |
| JP | 2006-319216 | 11/2006 |
| JP | 4201548 | 12/2008 |
| JP | 4575189 | 11/2010 |

OTHER PUBLICATIONS

Chinese Office Action, dated Dec. 5, 2016, issued in corresponding Chinese Patent Application No. 201410309543.1, includes English translation. Total 18 pages.

\* cited by examiner

ELECTROMAGNETIC SHIELDING FILM, FLEXIBLE PRINTED WIRING BOARD WITH ELECTROMAGNETIC SHIELDING FILM, ELECTRONIC DEVICE AND METHOD FOR FORMING THE SAME

BACKGROUND OF THE INVENTION

Field of the Invention

The present invention relates to an electromagnetic shielding film, a flexible printed wiring board provided with the electromagnetic shielding film, an electronic device provided with the flexible printed wiring board, and a method for forming the same.

Priority is claimed on Japanese Patent Application No. 2013-139991, Jul. 3, 2013, the content of which is incorporated herein by reference.

Description of the Related Art

An electromagnetic shielding film is provided on a surface of a flexible printed wiring board in order to shield an electromagnetic wave noise generated from the flexible printed wiring board and an electromagnetic wave noise generated from outside.

For example, the following flexible printed wiring board is proposed as a flexible printed wiring board with an electromagnetic wave shielding film.

(1) Japanese Patent Publication No. 4201548 discloses a flexible printed wiring board provided with an electromagnetic shielding film 100 which includes a flexible printed wiring board 120 in which a printed circuit 124 and an insulating film 126 are provided on at least one surface of a base film 122 and an electromagnetic shielding film 110 in which an electromagnetic shielding layer 118 including a metal thin film layer 114 and a conductive adhesive layer 116 is provided on a surface of a cover film 112 as illustrated in FIG. 9. The conductive adhesive layer 116 is adhered to a surface of the insulating film 126 and a surface of a ground circuit 124a in an opening portion 126a of the insulating film 126.

Recently, in order to reliably ground the electromagnetic shielding film, an electromagnetic shielding layer of the electromagnetic shielding film has been electrically connected to an external conductor other than the flexible printed wiring board, which is a housing at least a portion of which has conductivity, a conductor which functions as ground, or the like, and the external conductor has been used as ground of the electromagnetic shielding film.

For example, the following flexible printed wiring board is proposed as a flexible printed wiring board with the electromagnetic wave shielding film which can electrically connects the electromagnetic shielding layer of the electromagnetic shielding film to the external conductor.

(2) Japanese Patent Publication No. 4201548 discloses the flexible printed wiring board with the electromagnetic wave shielding film illustrated in FIG. 9 in which a ground part 130 including a conductive bump 132 (protrusion object) which penetrates the cover film 112 is provided on a surface of the cover film 112 while an adhesive layer 134 is interposed between the ground part 130 and the cover film 112 as illustrated in FIG. 10.

However, according to the flexible printed wiring board with the electromagnetic wave shielding film described in (2), in order to secure the electrical connection between the electromagnetic shielding layer of the electromagnetic shielding film and the external conductor, the conductive bump penetrating the cover film should be provided. Therefore, electrically connecting the electromagnetic shield layer and the external conductor is complicated. Additionally, there is a possibility that the conductive bump may not penetrate the cover film or that the conductive bump may not reach the electromagnetic shielding layer if the conductive bump penetrates the cover film. Therefore, the electrical connection between the electromagnetic shielding layer and the external conductor is uncertain.

For example, the following flexible printed wiring board is proposed as an electromagnetically shielded flexible printed wiring board which can electrically connect the electromagnetic shielding layer of the electromagnetic shielding film to the external conductor without using the conductive bump.

(3) Japanese Patent Publication No. 4575189 discloses the electromagnetically shielded flexible printed wiring board 102 as illustrated in FIG. 11. The cover film 112 is eliminated from the flexible printed wiring board with the electromagnetic wave shielding film 100 illustrated in FIG. 9, and an anisotropic conductive adhesive sheet 140 which has conductivity in a thickness direction by conductive particles 142 is provided on a surface of the metal thin film layer 114.

The flexible printed wiring board may be required for a thermal resistance since an electronic component, a terminal, and the like are soldered with the flexible printed wiring board. When the electromagnetically shielded flexible printed wiring board described in (3) is required for the thermal resistance, a polyimide film which has superior thermal resistance is used for the base film and the insulating film, and a cured material of a thermosetting adhesive with the superior thermal resistance such as an epoxy resin is used for the conductive adhesive layer. Further, an anisotropic conductive adhesive sheet without the heat resistance cannot be provided to the electromagnetically shielded flexible printed wiring board in advance. When the flexible printed wiring board with the electromagnetic wave shielding layer without the anisotropic conductive adhesive sheet is adhered to the external conductor, the anisotropic conductive adhesive sheet is provided between the flexible printed wiring board with the electromagnetic wave shielding layer and the external conductor.

Therefore, it is only necessary to provide the electromagnetic shielding layer on the surface of the flexible printed wiring board. As a method for providing only the electromagnetic shielding layer on the flexible printed wiring board, it is considered that, as shown in FIG. 12, an electromagnetic shielding layer transferring film 150 in which the electromagnetic shielding layer 118 including the metal thin film 114 and the conductive adhesive layer 116 are provided on a surface of a peeling film 152 is adhered to the surface of the flexible printed wiring board 120, and the peeling film 152 is peeled after curing the conductive adhesive layer 116.

However, the following phenomenon may occur in the above-described method.

i) It is difficult to form the metal thin film 114 on the surface of the peeling film 152 by a vapor deposition.

ii) Since the adhesion of the peeling film 152 and the metal thin film 114 is strong, the metal thin film 114 is easily peeled along with the peeling film 152 when the peeling film 152 is peeled.

iii) Since the cured conductive adhesive layer 116 is fragile, the electromagnetic shielding layer 118 easily breaks when the peeling film 152 is peeled.

In order to form the flexible printed wiring board with electromagnetic shielding layer with a favorable yield, practically, it is necessary to directly form the conductive adhesive layer on the flexible printed wiring board by a wet process and further form the metal thin film thereover.

In view of simplicity of forming, a method in which the independent electromagnetic shielding film is prepared, and the electromagnetic shielding film is adhered to the flexible printed wiring board by a dry process is desired.

SUMMARY OF THE INVENTION

One embodiment of the present invention is made in consideration of such a situation and provides the following embodiments: (1) an electromagnetic shielding film which has a favorable thermal resistance and is capable of forming a flexible printed wiring board with an electromagnetic shielding film which can electrically connect the electromagnetic shielding film to an external conductor other than the flexible printed wiring board simply and with a favorable yield; (2) a flexible printed wiring board with an electromagnetic shielding film which has a favorable thermal resistance and in which the electromagnetic shielding film is difficult to break when a peeling substrate is peeled from the electromagnetic shielding film, and the electromagnetic shielding film can be connected to an external conductor other than the flexible printed wiring board after peeling the peeling substrate; (3) an electronic device provided with a flexible printed wiring board with an electromagnetic shielding film in which a ground of the electromagnetic shielding film is strengthened; and (4) a method for forming the same.

A electromagnetic shielding film according to one embodiment of the present invention includes a conductive supporting substrate which includes a cured material of a thermosetting adhesive including a conductive filler, a metal thin film layer which covers one surface of the conductive supporting substrate, a thermosetting adhesive layer which covers a surface of the metal thin film layer, and a peeling substrate which covers the other surface of the conductive supporting substrate.

In some cases, a storage modulus of the conductive supporting substrate at 180° C. may be from $8 \times 10^6$ to $1 \times 10^8$ Pa.

In some cases, in the electromagnetic shielding film according to one embodiment of the present invention, the thermosetting adhesive layer may be adhered to at least one surface of a flexible printed wiring board in which a printed circuit is provided on at least one surface of a base film including a polyimide, and the conductive supporting substrate may be electrically connected to an external conductor other than the flexible printed wiring board by an anisotropic conductive adhesive sheet which has conductivity in a thickness direction after peeling the peeling substrate.

In some cases, the conductive filler may be a fibrous conductive filler.

A flexible printed wiring board with an electromagnetic shielding film according to another embodiment of the present invention includes a flexible printed wiring board which includes a base film including polyimide and a printed circuit positioned on at least one surface of the base film and the electromagnetic shielding film according to one embodiment of the present invention in which the thermosetting adhesive layer is adhered to at least one surface of the flexible printed wiring board and the thermosetting adhesive layer is cured.

In some cases, the peeling substrate may be peeled from the flexible printed wiring board with the electromagnetic shielding film according to another embodiment of the present invention.

A flexible printed wiring board with the electromagnetic shielding film according to another embodiment of the present invention includes a flexible printed wiring board which includes a base film including polyimide and a printed circuit positioned on at least one surface of the base film, and an electromagnetic shielding film. The electromagnetic shielding film includes a conductive supporting substrate which includes a cured material of a thermosetting resin including a conductive filler, a metal thin film layer which covers one surface of the conductive supporting substrate, and a thermosetting adhesive layer which covers a surface of the metal thin film layer. The thermosetting adhesive layer is adhered to at least one surface of the flexible printed wiring board. The thermosetting adhesive layer is cured.

An electronic device according to still another embodiment of the present invention includes a housing at least a portion of which has conductivity, the flexible printed wiring board with the electromagnetic shielding film according to another embodiment of the present invention, an anisotropic conductive adhesive sheet which is positioned between the housing and the flexible printed wiring board with the electromagnetic shielding film, electrically connects the housing and the conductive supporting substrate, and has conductivity in a thickness direction.

A method of forming an electromagnetic shielding film according to one embodiment of the present invention, includes forming a conductive supporting substrate made of a cured material of a thermosetting resin which includes a conductive filler by applying and curing a thermosetting resin composition which includes the conductive filler on one surface of a peeling substrate, forming a metal thin film layer on a surface of the conductive supporting substrate, and forming a thermosetting adhesive layer on a surface of the metal thin film layer.

A method of forming a flexible printed wiring board with the electromagnetic shielding film according to another embodiment of the present invention, includes adhering and curing the thermosetting adhesive layer of the electromagnetic shielding film obtained by the method for forming the electromagnetic shielding film according to one embodiment of the present invention on at least one surface of a flexible printed wiring board in which a printed circuit is provided on at least one surface of a base film including polyimide.

In some cases, the method of forming the flexible printed wiring board with the electromagnetic shielding film according to another embodiment of the present invention may further includes peeling the peeling substrate.

A method for forming an electronic device according to still another embodiment of the present invention, includes attaching a housing at least a portion of which has conductivity and the flexible printed wiring board with the electromagnetic shielding film obtained by the method of forming the flexible printed wiring board with the electromagnetic shielding film according to another embodiment of the present invention by an anisotropic conductive adhesive sheet having conductivity in a thickness direction and electrically connecting the housing and the conductive supporting substrate.

According to the electromagnetic shielding film according to one embodiment of the present invention, the flexible printed wiring board with the electromagnetic shielding film which has a favorable thermal resistance and can electrically connect the electromagnetic shielding film to the external conductor other than the flexible printed wiring board can be formed easily and with a favorable yield.

According to the method for forming the electromagnetic shielding film according to one embodiment of the present invention, the electromagnetic shielding film which can present the above-described advantageous effect can be formed.

The flexible printed wiring board with the electromagnetic shielding film according to another embodiment of the present invention has a favorable thermal resistance. Additionally, when the peeling substrate is peeled from the electromagnetic shielding film, the electromagnetic shielding film is difficult to break. After peeling the peeling substrate, the electromagnetic shielding film can be electrically connected to the external conductor other than the flexible printed wiring board.

According to the method for forming the flexible printed wiring board with the electromagnetic shielding film according to another embodiment of the present invention, the flexible printed wiring board with the electromagnetic shielding film of the present invention which can perform the above-mentioned advantageous effect can be formed easily and with a favorable yield.

The electronic device according to still another embodiment of the present invention is provided with the flexible printed wiring board with the electromagnetic shielding film in which the ground of the electromagnetic shielding film is strengthened.

According to the method for forming the electronic device according to still another embodiment of the present invention, the electronic device which can perform the above-mentioned advantageous effect can be formed.

DETAILED DESCRIPTION OF THE PREFERRED EMBODIMENTS

Hereinafter, embodiments of the invention will be described with reference to the drawings.

"Sphericity of conductive particle" in the present specification is defined as follows. At least thirty conductive particles are selected randomly from an image of an electron microscope of the conductive particles. The minimum diameter and the maximum diameter of each of the conductive particles are measured, and the sphericities are calculated by the following formula. An average of the sphericities of the measured (at least thirty) conductive particles is the "sphericity of conductive particle".

Sphericity=Maximum diameter/Minimum diameter

"Average particle diameter of conductive particles" in the present specification is defined as follows. The median of the minimum diameter and the maximum diameter obtained when the above-described sphericity is obtained is regarded as a diameter of a particle diameter of a particle. An arithmetical average of the particle diameters of the measured at least thirty particles is the "average particle diameter of conductive particles".

"A facing B" in the present specification means a state of A overlapping at least a portion of B when viewed from above.

"Thickness direction" in the present specification means a perpendicular direction with respect to a top surface or bottom surface of a substrate, layer, thin film or the like. The perpendicular direction may be an approximately perpendicular direction and have a difference of −15° to +15° from the perpendicular direction.

"Plane direction" in the present specification means a parallel direction with respect to a top surface or bottom surface of a substrate, layer, thin film or the like. The parallel direction may be an approximately parallel direction and have a difference of −15° to +15° from parallel direction.

<Electromagnetic Shielding Film>

Figure 1:
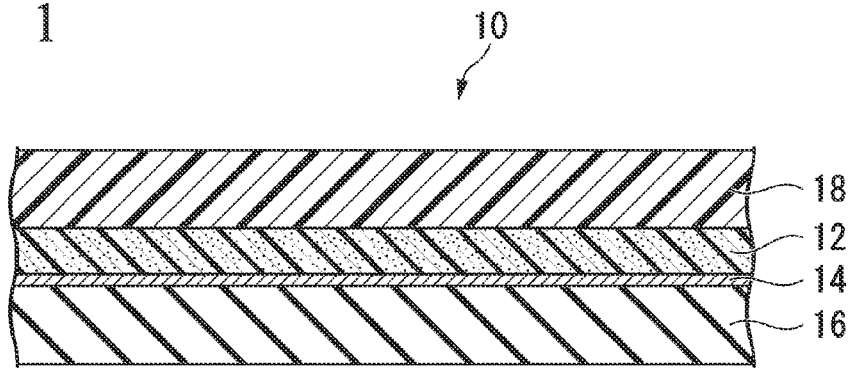
FIG. 1 is a cross-sectional view illustrating one aspect of an electromagnetic shielding film of one embodiment of the present invention.

FIG. 1 is a cross-sectional view illustrating one aspect of an electromagnetic shielding film of one embodiment of the present invention.

An electromagnetic shielding film 10 includes a conductive supporting substrate 12, a metal thin film layer 14 which covers one surface of the conductive supporting substrate 12, a thermosetting adhesive layer 16 which covers a surface of the metal thin film layer 14, a peeling film 18 which covers the other surface of the conductive supporting substrate 12. The peeling film 18 is also referred to as a peeling substrate and a separator.

According to the electromagnetic shielding film 10, the thermosetting adhesive layer 16 is preferably adhered to at least one surface of a flexible printed wiring board. The flexible printed wiring board includes a printed circuit provided on at least one surface of a base film including polyimide. Further, according to the electromagnetic shielding film 10, after peeling the peeling film 18, the conductive supporting substrate 12 is preferable to be electrically connected to an external conductor other than the flexible printed wiring board by an anisotropic conductive adhesive sheet which has conductivity in the thickness direction.

The external conductor other than the flexible printed wiring board is a housing at least a portion of which has conductivity, a conductor which functions as ground, or the like.

<Conductive Supporting Substrate>

The conductive supporting substrate 12 is made of a cured material of a thermosetting resin which includes a conductive filler. The conductive supporting substrate 12 has conductivity in a thickness direction and a plane direction. By forming a matrix (main component) of the conductive supporting substrate 12 by the cured material of a thermosetting resin, a heat resistance of the electromagnetic shielding film 10 becomes favorable.

An epoxy resin, a phenol resin, an amino resin, an alkyd resin, a urethane resin, a synthetic rubber, an ultraviolet curable acrylate resin, and the like are given as the thermosetting resin. In view of a favorability of the heat resistance, the epoxy resin is preferable.

A fibrous conductive filler (a carbon nanofiber, a carbon nanotube, a nanowire of a metal such as copper, platinum, gold, silver, nickel, and the like), a particle of a metal such as silver, platinum, gold, copper, nickel, palladium, aluminum, solder, a baked carbon particle plated with a metal such as silver, gold, nickel and solder, and the like are given as the conductive filler. Since the conductivity of the conductive supporting substrate 12, specifically the conductivity in the plane direction, can be secured with a small quantity of the conductive filler and the conductive supporting substrate 12 can sufficiently function as an electromagnetic shielding layer, the fibrous conductive filler is preferable, and the nanowire of metal is more preferable.

An average fiber length of the fibrous conductive filler is preferably from 1.0 µm to 5.0 µm. When the average fiber length of the fibrous conductive filler is 1.0 µm or more, a dispersion of the conductive filler becomes favorable. When the average fiber length of the fibrous conductive filler is 5.0 µm or less, a conductive path is efficiently formed.

An average fiber diameter of the fibrous conductive filler is preferably from 0.01 µm to 5 µm. When the average fiber diameter of the fibrous conductive filler is 0.01 µm or more, the conductive supporting substrate 12 can be formed to be thin. When the average fiber diameter of the fibrous conductive filler is 5 µm or less, the fibrous conductive filler has sufficient cross-sectional area and has a low conductor resistance.

An average diameter of the particle of the metal or the baked carbon particle plated with the metal is preferably from 1.0 µm to 10 µm. When the average diameter of the particle of metal or the baked carbon particle plated with the metal is 1.0 µm or more, the conductive supporting substrate 12 can be formed to be thin. When the average diameter of the particle of metal or the baked carbon particle plated with the metal is 10 µm or less, the conductive supporting substrate 12 with a sufficient strength can be obtained.

The content of the conductive filler with respect to 100 vol % of the conductive supporting substrate 12 is preferably from 0.5 vol % to 50 vol %, more preferably from 1 vol % to 20 vol %. When content of the conductive filler is 0.5 vol % or more, the conductivity of the conductive supporting substrate 12 can be sufficiently secured. When content of the conductive filler is 50 vol % or less, a price of the electromagnetic shielding film 10 can be lowered since a usage of the conductive filler can be reduced.

The storage modulus at 180° C. of the conductive supporting substrate 12 is preferably from $8*10^6$ Pa to $1*10^8$ Pa, more preferably from $1*10^7$ Pa to $5*10^7$ Pa. Since the cured material of the thermosetting resin is normally hard, a film made of the cured material lacks of elasticity, especially, when the thickness of the film is reduced, the film is easily breakable and lacks strength as a self-supporting film. Therefore, the thermosetting resin with high molecular weight or the rubber is added to the conductive supporting substrate 12 so that the elasticity and the strength of the conductive supporting substrate 12 are balanced with the heat resistance by elongating an average distance of cross-linking points. The conductive supporting substrate 12 should have a sufficient strength under the temperature at which the peeling film 18 is peeled, specifically the thermosetting adhesive is cured, for example, from 150° C. to 200° C. Therefore, the storage modulus at 180° C. of the conductive supporting substrate 12 is preferably $8*10^6$ Pa or more at which the conductive supporting substrate 12 is not softened. The storage modulus at 180° C. of the conductive supporting substrate 12 is preferably $1*10^8$ Pa or less so that the hardness does not increase by filling the conductive filler in large quantities. As a result, the electromagnetic shielding film 10 as well as the conductive supporting substrate 12 is difficult to break when the peeling film 18 is peeled.

The rubber included in the conductive supporting substrate 12 is an elastic body which imparts a flexibility to the conductive supporting substrate 12 without reducing the heat resistance. For example, a carboxylated nitrile butadiene rubber and the like are given. A content of the rubber in the conductive supporting substrate 12 with respect to 100 vol % of the conductive supporting substrate 12 is preferably from 10 vol % to 90 vol %. When the content of the rubber is 10 vol % or more, a sufficient flexibility can be obtained. When the content of the rubber is more than 90 vol %, the heat resistance becomes insufficient.

The storage modulus is calculated from a stress given to a sample and a detected strain and can be measured as one of viscoelasticity characteristics by using a dynamic viscoelasticity measurement device which outputs a function of temperature or time.

The thickness of the conductive supporting substrate 12 is preferably from 1 µm to 10 µm, more preferably from 1 µm to 5 µm.

When the thickness of the conductive supporting substrate 12 is 1 µm or more, the heat resistance of the conductive supporting substrate 12 becomes preferable. When the thickness of the conductive supporting substrate 12 is 10 µm or less, the electromagnetic shielding film 10 can be thinned. The thickness of the conductive supporting substrate 12 is calculated as follows. An image of a cross section of the electromagnetic shielding film 10 is taken, a dimension from the bottom surface to the highest portion of the conductive supporting substrate 12 is measured at five arbitrary points of the image, then the average of the measured dimensions are obtained.

A surface electrical resistance of the conductive supporting substrate 12 is preferably from 10Ω to 100,000Ω, more preferably from 20Ω to 10,000Ω. When the surface electrical resistance of the conductive supporting substrate 12 is 10Ω or more, the content of the conductive filler can be reduced, and the storage modulus at 180° C. of the conductive supporting substrate 12 can be easily adjusted in the above-mentioned range. When the surface electrical resistance of the conductive supporting substrate 12 is 100,000Ω or less, an entire surface of the conductive supporting substrate 12 can have uniform conductivity.

The surface electrical resistance of the conductive supporting substrate 12 is measured by a four-point probe method in accordance with JIS-K7194. According to the four-point probe method, four probes are arranged on a straight line on a test piece, by passing a constant current through two outer probes and measuring the voltage through the inner probes, a resistivity is obtained. The surface electrical resistance is calculated from the resistivity and the thickness of the test piece.

<Metal Thin Film Layer>

The metal thin film layer 14 is a layer made of a metal thin film. Since the metal thin film layer 14 is formed to be spread in a plane direction, the metal thin film layer 14 has conductivity in the plane direction and functions as the electromagnetic shielding layer and the like.

A metal thin film formed by a physical vapor deposition (a vacuum deposition, sputtering, an ion beam deposition, and the like), a chemical vapor deposition, plating, or the like and a metallic foil are given as the metal thin film layer 14. The metal thin film layer 14 is preferably the metal thin film formed by the physical vapor deposition (vapor deposition film) since the film thickness can be small, the conductivity in the plane direction is preferable even if the film thickness is small, and the metal thin film layer 14 can be easily formed by dry processes.

Aluminum, silver, copper, gold, conductive ceramics, and the like are given as a material of the metal thin film included in the metal thin film layer 14. As the conductive ceramics, titanium carbide, silicon carbide, tungsten carbide, chromium boride, molybdenum boride, nickel nitride, tantalum nitride, and zirconium nitride are given. In light of the electric conductivity, copper is preferable. In light of a chemical stability, the conductive ceramics is preferable.

The thickness of the metal thin film layer 14 is preferably from 0.01 µm to 1 µm, more preferably from 0.1 µm to 1 µm.

When the thickness of the metal thin film layer 14 is 0.01 µm or more, the conductivity in the plane direction is more preferable. When the thickness of the metal thin film layer 14 is 0.1 µm or more, a shielding effect of the electromagnetic wave noise is further preferable. When the thickness of the metal thin film layer 14 is 1 µm or less, the electromagnetic shielding film 10 can be thin. Additionally, productivity and a flexibility of the electromagnetic shielding film 10 are preferable.

The thickness of the metal thin film layer 14 is calculated as follows. An image of a cross section of the electromagnetic shielding film 10 is taken, a dimension from the bottom surface to the highest portion of the metal thin film layer 14 is measured at five arbitrary points of the image, then an average of the measured dimensions are obtained.

A surface electrical resistance of the metal thin film layer 14 is preferably from $0.001\Omega$ to $1\Omega$, more preferably from $0.001\Omega$ to $0.1\Omega$. When the surface electrical resistance of the conductive supporting substrate 12 is $0.1\Omega$ or more, the thickness of the metal thin film layer 14 can be sufficiently thin. When the surface electrical resistance of the conductive supporting substrate 12 is $1\Omega$ or less, the metal thin film layer 14 can sufficiently function as the electromagnetic shielding film.

The surface electrical resistance of the metal thin film layer 14 is measured by the four-point probe method in accordance with JIS-K7194.

<Thermosetting Adhesive Layer>

The thermosetting adhesive layer 16 does not have conductivity in the thickness direction and the plane direction. The thermosetting adhesive layer 16 has an adhesive property. The thermosetting adhesive layer 16 can perform the heat resistance after being cured. In the case where the metal thin film layer 14 is electrically connected to a ground circuit of the flexible printed wiring board, the thermosetting adhesive layer 16 may include the conductive particle described later.

An epoxy resin, a phenol resin, an amino resin, an alkyd resin, a urethane resin, a synthetic rubber, an ultraviolet curable acrylate resin, and the like are given as the thermosetting adhesive. In view of favorability of heat resistance, the epoxy resin is preferable. The epoxy resin may include a rubber component (carboxylated nitrile butadiene rubber or the like) for imparting flexibility and a tackifier.

Further, in order to improve the strength and the punching property of the thermosetting adhesive layer 16, a cellulose resin or a microfibril such as a glass fiber can be added to the thermosetting adhesive layer 16.

The thickness of the thermosetting adhesive layer 16 is preferably from 5 µm to 15 µm, more preferably from 2 µm to 10 µm. When the thickness of the thermosetting adhesive layer 16 is 5 µm or more, the sufficient adhesive strength with respect to the flexible printed wiring board can be obtained. When the thickness of the thermosetting adhesive layer 16 is 15 µm or less, the electromagnetic shielding film 10 can be thin. The thickness of the thermosetting adhesive layer 16 is the thickness of the thermosetting adhesive layer 16 after being cured and calculated as follows. An image of a cross section of the electromagnetic shielding film 10 is taken, a dimension from the bottom surface to the highest portion of the thermosetting adhesive layer 16 is measured at five arbitrary points of the image, then an average of the measured dimensions are obtained.

A surface electrical resistance of the thermosetting adhesive layer 16 is preferably $1*10^6\Omega$ or more when the metal thin film layer 14 is not electrically connected to the ground circuit of the flexible printed wiring board. The surface electrical resistance of the thermosetting adhesive layer 16 is measured by the four-point probe method in accordance with JIS-K7194.

<Peeling Film>

The peeling film 18 is a carrier film when the conductive supporting substrate 12 and the metal thin film layer 14 are formed. The peeling film 18 improves the handling ability of the electromagnetic shielding film 10. After the electromagnetic shielding film 10 is adhered to the flexible printed wiring board or the like, the peeling film 18 is peeled from the electromagnetic shielding film 10.

A known peeling film such as a separator one surface of which is treated to have a mold release property may be used as the peeling film 18.

The surface of the thermosetting adhesive layer 16 may be covered with a second peeling film (not illustrated in the drawings) as necessary.

<Thickness of Electromagnetic Shielding Film>

The thickness of the electromagnetic shielding film 10 (except for the peeling film 18) is preferably from 10 µm to 45 µm, more preferably from 10 µm to 30 µm. The thickness of the electromagnetic shielding film 10 is calculated as follows. An image of a cross section of the electromagnetic shielding film 10 is taken, a dimension from the bottom surface to the highest portion of the electromagnetic shielding film 10 is measured at five arbitrary points of the image, then an average of the measured dimensions are obtained.

<Operation and Effect>

According to the electromagnetic shielding film 10 described above, since the conductive supporting substrate 12 is made of the cured material of the thermosetting resin, and the thermosetting adhesive layer 16 is made of the thermosetting adhesive, the flexible printed wiring board with the electromagnetic shielding film with a preferable thermal resistance can be obtained.

Since the electromagnetic shielding film 10 described above includes the conductive supporting substrate 12, the electromagnetic shielding film 10 is difficult to break when the peeling film 18 is peeled. Consequently, the flexible printed wiring board with the electromagnetic shielding film can be formed with a favorable yield. Further, the electromagnetic shielding layer, namely, the conductive supporting substrate 12 and the metal thin film layer 14, can be arranged on the surface of the flexible printed wiring board by the dry processes, the flexible printed wiring board with the electromagnetic shielding film can be simply formed. When the storage modulus at 180° C. of the conductive supporting substrate 12 is from $8 \times 10^6$ to $1 \times 10^8$ Pa, the electromagnetic shielding film 10 is more difficult to break when the peeling film 18 is peeled.

According to the electromagnetic shielding film 10 described above, since the conductive supporting substrate 12 includes the conductive filler, the flexible printed wiring board with the electromagnetic shielding film which can electrically connect the electromagnetic shielding film to the external conductor other than the flexible printed wiring board by the anisotropic conductive adhesive sheet which has conductivity in the thickness direction after the peeling film 18 is peeled can be obtain.

<Method for Forming Electromagnetic Shielding Film>

A method for forming an electromagnetic shielding film according to one embodiment of the present invention includes the following steps (a) to (c):

(a) forming a conductive supporting substrate made of a cured material of a thermosetting resin which includes a conductive filler by applying and curing a thermosetting resin composition which includes the conductive filler on one surface of a peeling substrate;

(b) forming a metal thin film layer on a surface of the conductive supporting substrate; and (c) forming a thermosetting adhesive layer on a surface of the metal thin film layer.

<Step (a)>

Figure 2:
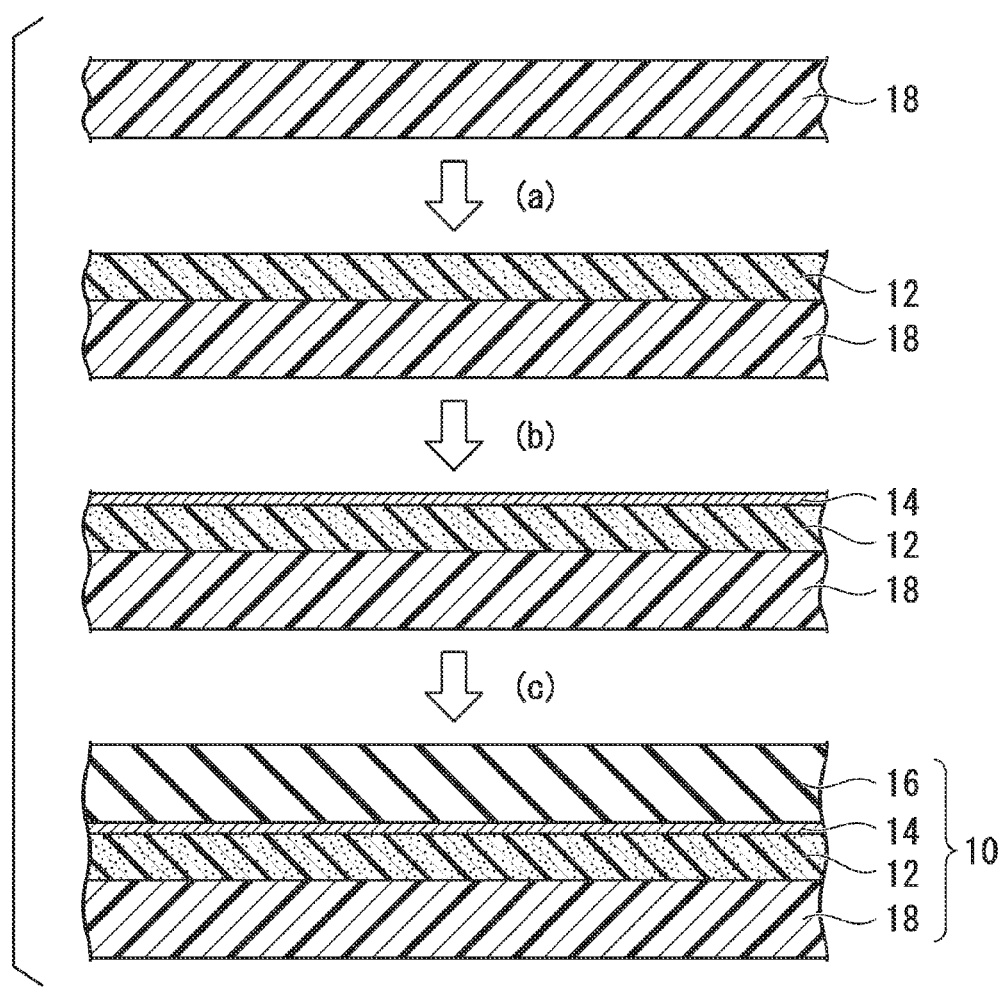
FIG. 2 is a cross-sectional view illustrating the electromagnetic shielding film in a step involved in a method of forming the electromagnetic shielding film of one embodiment of the present invention.

As illustrated in FIG. 2, the thermosetting resin composition including the conductive filler is applied to one surface of the peeling film 18 (the peeling substrate). Then, the conductive supporting substrate 12 made of the cured material of the thermosetting resin which includes the conductive filler is formed by curing the thermosetting resin composition at 120° C. to 160° C. for 0.5 to 2.0 hours.

The thermosetting resin composition includes the above-described the thermosetting resin and the conductive filler and if necessary, a solvent and other compositions such as a dispersant, a fire retarding material, a colorant, a viscosity modifier, an oxidant inhibitor.

Since the conductive supporting substrate 12 is formed by applying the thermosetting resin composition, the conductive supporting substrate 12 can be relatively thin. Here, since the cured material of the thermosetting resin is hard, the strength is insufficient when the conductive supporting substrate 12 is thin. However, as described above, the elasticity and the strength are preferably balanced with the heat resistance by setting the storage modulus at 180° C. of the conductive supporting substrate 12 as from $8*10^6$ to $1*10^8$ Pa.

Controlling the storage modulus of the conductive supporting substrate 12 is performed by selecting types or compositions of a reactive monomer or oligomer, a curative agent and the like in view of equivalences (crosslink density) of the reactive monomer or oligomer, the curative agent and the like and a toughness of their structures and adjusting the storage modulus of the cured material of the thermosetting resin.

Other than this, the storage modulus of the conductive supporting substrate 12 can be adjusted by controlling curing conditions such as a temperature, time, and the like when curing the thermosetting resin or selecting and adding a thermoplastic resin such as a thermoplastic elastomer as a composition which does not have a thermosetting property.

<Step (b)>

As illustrated in FIG. 2, the metal thin film layer 14 is formed on a surface of the conductive supporting substrate 12.

As a method for forming the metal thin film layer 14, a method for forming a metal thin film by a physical vapor deposition, a chemical vapor deposition, plating, or the like, attaching a metal foil, and the like are given. Since the metal thin film layer 14 which has preferable conductivity in the plane direction can be formed, the method for forming the metal thin film by the physical vapor deposition, the chemical vapor deposition, plating, or the like is preferable. Since the thickness of the metal thin film layer 14 can be small, the metal thin film layer 14 whose conductivity in the plane direction is preferable can be formed even if the film thickness is small, and the metal thin film layer 14 can be easily formed by the dry processes, the physical vapor deposition is more preferable.

<Step (c)>

As illustrated in FIG. 2, the thermosetting adhesive layer 16 is formed on the surface of the metal thin film layer 14. The surface of the thermosetting adhesive layer 16 may be covered with the second peeling film (not illustrated in the drawings) as necessary. As the second peeling film, the same film as the peeling film 18 can be used.

As a method for forming the thermosetting adhesive layer 16, a method of applying the thermosetting adhesive composition on the surface of the metal thin film layer 14, a method of attaching a thermosetting adhesive sheet on the surface of the metal thin film layer 14 and the like are given. Since the thermosetting adhesive layer 16 is formed to be thin, the method of applying the thermosetting adhesive composition is preferable. In the case where the thermosetting adhesive composition is applied, a solution including the thermosetting adhesive composition using methyl ethyl ketone, ethyl acetate, toluene or the like as a solvent is applied on the surface of the metal thin film 14. The content of the thermosetting adhesive composition with respect to an entire volume of the solution including the thermosetting adhesive composition is preferably from 15 vol % to 65 vol %.

Here, the thermosetting adhesive layer 16 is cured by heating when the electromagnetic shielding film 10 and the flexible printed wiring board are connected. When the electromagnetic shielding film 10 exists as itself, the thermosetting adhesive layer 16 is not cured.

<Operation and Effect>

Since the method for forming the electromagnetic shielding film according to one embodiment of the present invention described above includes the steps of (a) to (c), the electromagnetic shielding film according to one embodiment of the present invention which can present the above-described advantageous effect can be formed.

<Flexible Printed Wiring Board with Electromagnetic Shielding Film>

Figure 3:
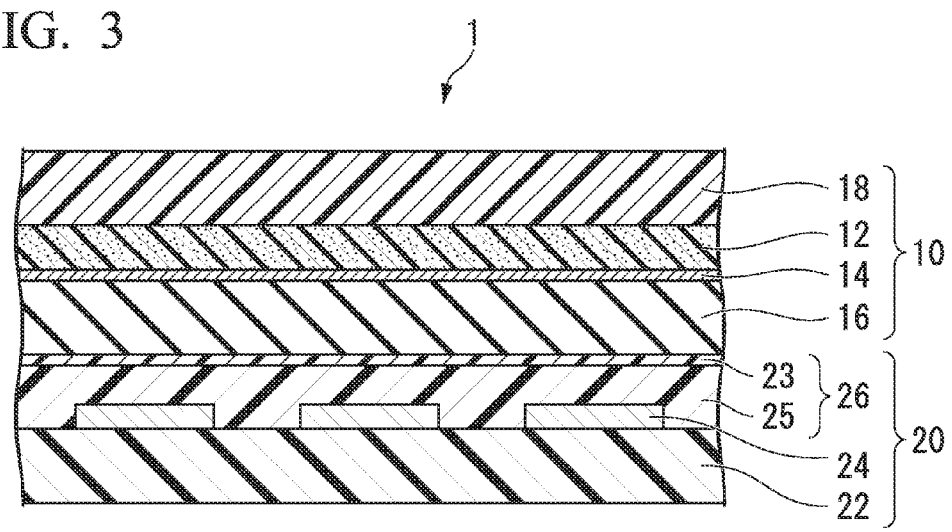
FIG. 3 is a cross-sectional view illustrating one aspect of a flexible printed wiring board with the electromagnetic shielding film of another embodiment of the present invention.

FIG. 3 is a cross-sectional view illustrating one aspect of a flexible printed wiring board with the electromagnetic shielding film of another embodiment of the present invention.

The flexible printed wiring board with the electromagnetic shielding film 1 includes a flexible printed wiring board 20 and the electromagnetic shielding film 10. The thermosetting adhesive layer 16 is adhered on at least one surface of the electromagnetic shielding film 10 and is cured. In the flexible printed wiring board 1, a printed circuit 24 and an insulating film 26 are provided on at least one surface of a base film 22.

In the flexible printed wiring board with the electromagnetic shielding film 1, the peeling film 18 may be peeled. In other words, the flexible printed wiring board with the electromagnetic shielding film 1 includes the base film which includes polyimide, the printed circuit which positions on at least one surface of the base film, and the electromagnetic shielding film. The electromagnetic shielding film includes the conductive supporting substrate made of the cured material of the thermosetting resin including the conductive filler, the metal thin film layer which covers one surface of the conductive supporting substrate, and the thermosetting adhesive layer which covers the metal thin film layer. The thermosetting adhesive layer is adhered to at least one surface of the flexible printed wiring board and is cured.

The metal thin film layer 14 of the electromagnetic shielding film 10 is separately positioned in the vicinity of the printed circuit 24 (a signal circuit, a ground circuit, a ground layer and the like) so as to face the printed circuit 24 while the insulating film 26 and the thermosetting adhesive layer 16 are interposed therebetween. In other words, the metal thin film layer 14 of the electromagnetic shielding film 10 is positioned so as to face the printed circuit 24 while the insulating film 26 and the thermosetting adhesive layer 16 are interposed between the metal thin film layer 14 and the printed circuit 24.

The distance between the printed circuit 24 and the metal thin film layer 14 is a sum of the thickness of the insulating film 26 and the thickness of the thermosetting adhesive layer 16. The distance between the printed circuit 24 and the metal thin film layer 14 is preferably from 30 μm to 200 μm, more preferably from 60 μm to 200 μm. When the distance is smaller than 30 μm, the impedance of the signal circuit becomes low. Consequently, in order to achieve a characteristic impedance of such as 100Ω, a line width of the signal circuit should be small, which causes a variation of the characteristic impedance due to a variation of the line width. As a result, reflection/resonance noise due to the mismatch of impedance tends to be mixed with electronic signal. When the distance is greater than 200 μm, the flexible printed wiring board with the electromagnetic shielding film becomes thick and lacks the flexibility.

<Flexible Printed Wiring Board>

The flexible printed wiring board 20 includes the printed circuit 24 on the base film 22, the insulating film 26 including an adhesive layer 25 and a substrate film 23.

The flexible printed wiring board 20 is formed by patterning a copper foil of a copper-clad laminate in a desired pattern by a known etching method to form the printed circuit (a power source circuit, a ground circuit, a ground layer and the like).

As the copper-clad laminate, the base film 22 of which a copper foil is adhered to one or both surfaces by an adhesive layer (not illustrated in drawings); a copper foil on which a resin solution or the like forming the base film 22 is cast; and the like are given.

As a material of the adhesive layer, an epoxy resin, polyester, polyimide, polyamide imide, polyamide, a phenol resin, polyurethane, acrylic resin, melamine resin and the like are given.

The thickness of the adhesive layer is preferably from 0.5 μm to 30 μm. The thickness of the adhesive layer is measured by a contact-type dial gauge.

<Base Film>

As the base film 22, a polyimide film having the heat resistance is used.

A surface electrical resistance of the base film 22 is preferably $1*10^6 \Omega$ or more.

The thickness of the base film 22 is preferably from 0.5 μm to 200 μm. In view of flexibility, the thickness of the base film 22 is more preferably from 6 μm to 25 μm, further preferably, from 10 μm to 25 μm. The thickness of the base film 22 is measured by a contact-type dial gauge.

<Printed Circuit>

As the copper foil forming the printed circuit 24 (the signal circuit, the ground circuit, the ground layer and the like), a rolled copper foil, an electro-deposited copper foil and the like are given. In view of flexibility, the rolled copper foil is preferable.

The thickness of the copper foil is preferably from 1 μm to 50 μm, more preferably from 18 μm to 35 μm. The thickness of the copper foil is measured by a contact-type dial gauge.

An edge portion (terminal) in the longitudinal direction of the printed circuit 24 is not covered by the insulating film 26 and the electromagnetic shielding film 10 for a soldered joint, a connector joint, mounting parts or the like.

The insulating film 26 is a substrate film 23 on one surface of which the adhesive layer 25 is formed by applying an adhesive, attaching an adhesive sheet, or the like.

A surface electrical resistance of the substrate film 23 is preferably $1*10^6 \Omega$ to $1 \times 10^{14} \Omega$.

As the substrate film 23, a polyimide film having the heat resistance is used.

The thickness of the substrate film 23 is preferably from 1 μm to 100 μm. In view of flexibility, the thickness of the substrate film 23 is more preferably from 3 μm to 25 μm, further preferably, from 10 μm to 25 μm. The thickness of the substrate film 23 is measured by a contact-type dial gauge.

As a material of the adhesive layer 25, an epoxy resin, polyester, polyimide, polyamide imide, polyamide, a phenol resin, polyurethane, an acrylic resin, a melamine resin, polystyrene, polyolefin, and the like are given. The epoxy resin may include a rubber component (carboxylated nitrile butadiene rubber or the like) for imparting flexibility.

The thickness of the adhesive layer 25 is preferably from 1 μm to 100 μm, more preferably from 1.5 μm to 60 μm. The thickness of the adhesive layer 25 is measured by a contact-type dial gauge.

<Operation and Effect>

According to the flexible printed wiring board with the electromagnetic shielding film 1 described above, the heat resistance is preferable since the base film 22 is made of polyimide, and the electromagnetic shielding film 10 according to one embodiment of the present invention is used.

According to the flexible printed wiring board with the electromagnetic shielding film 1 described above, since the electromagnetic shielding film 10 according to one embodiment of the present invention is used, the electromagnetic shielding film 10 is difficult to break when the peeling film 18 is peeled from the electromagnetic shielding film 10, and the electromagnetic shielding film 10 can be electrically connected to the external conductor other than the flexible printed wiring board 20 after peeling the peeling film 18.

<Other Configuration>

A flexible printed wiring board with the electromagnetic shielding film according to another aspect of the present invention may include the flexible printed wiring board which includes the printed circuit provided on at least one surface of the base film including polyimide and the electromagnetic shielding film in which the thermosetting adhesive layer is adhered to at least one surface of the flexible printed wiring board and is cured according to one embodiment of the present invention and is not limited to the flexible printed wiring board with the electromagnetic shielding film 1 illustrated in drawings.

For example, the flexible printed wiring board may have a ground layer on its rear surface. The flexible printed wiring board may have the printed circuit on its rear surface, and an insulating film and the electromagnetic shielding film according to one embodiment of the present invention may be attached to the rear surface of the flexible printed wiring board. Also, the conductive particle described below is included in the thermosetting adhesive layer 16, an opening portion is formed in the insulating film 26, and the metal thin film layer 14 may be electrically connected to the ground circuit of the flexible printed wiring board 20.

<Method for Forming Flexible Printed Wiring Board with Electromagnetic Shielding Film>

A method for forming a flexible printed wiring board with the electromagnetic shielding film according to another aspect of the present invention includes the following steps (d) and (e).

(d) adhering and curing a thermosetting adhesive layer of an electromagnetic shielding film obtained by the method for forming the electromagnetic shielding film according to one aspect of the present invention on at least one surface of a flexible printed wiring board in which a printed circuit is provided on at least one surface of a base film including polyimide.

(e) optionally peeling the peeling substrate.

(Step (d))

Figure 4:
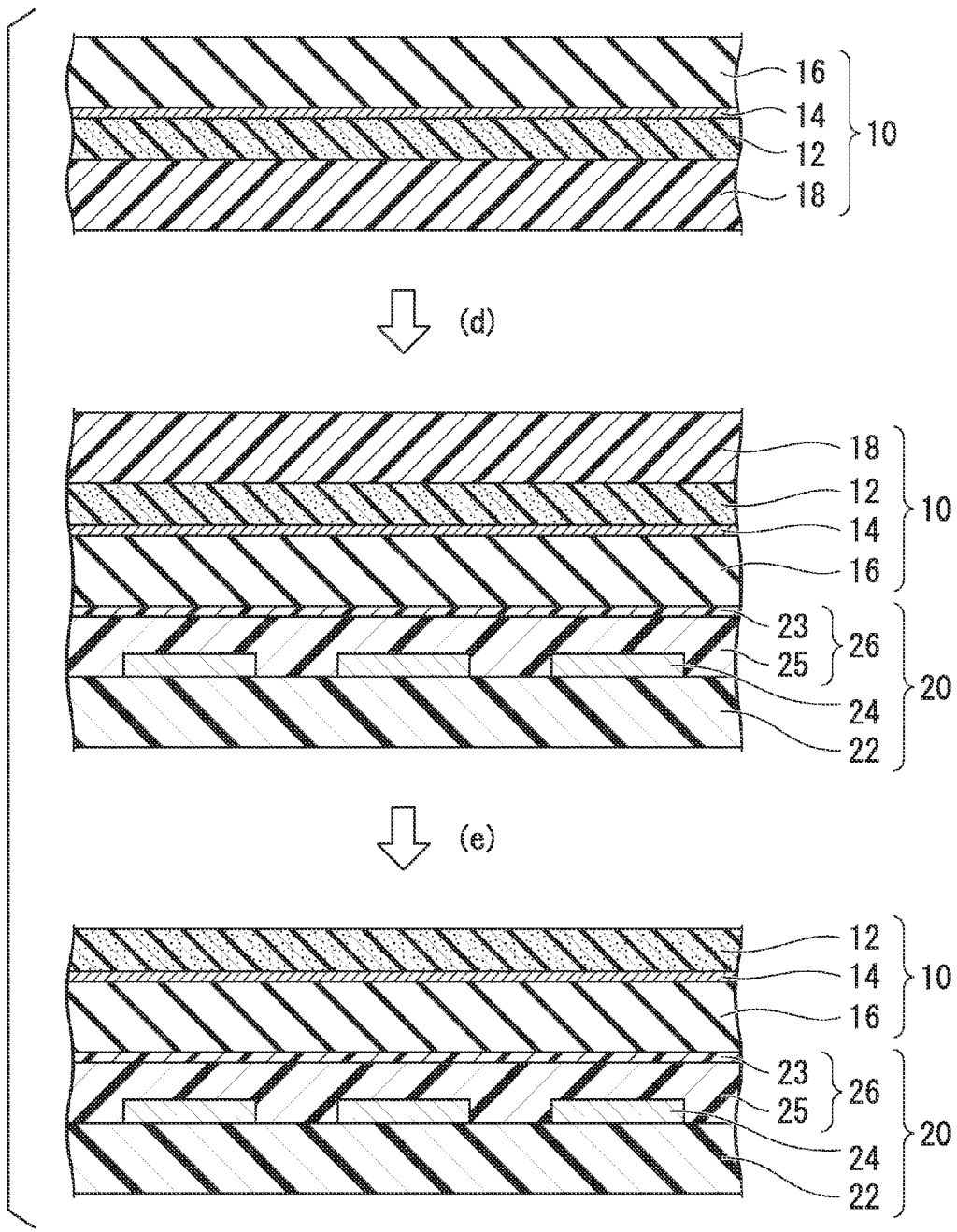
FIG. 4 is a cross-sectional view illustrating the flexible printed wiring board with the electromagnetic shielding film in a step involved in a method of forming the flexible printed wiring board with the electromagnetic shielding film of another embodiment of the present invention.

As illustrated in FIG. 4, the shielding film 10 includes a conductive supporting substrate 12, a metal thin film layer 14 which covers one surface of the conductive supporting substrate 12, a thermosetting adhesive layer 16 which covers a surface of the metal thin film layer 14, a peeling film 18 (also referred to as the peeling substrate) which covers the other surface of the conductive supporting substrate 12. The flexible printed wiring board 20 includes the printed circuit 24 on the base film 22, the insulating film 26 which includes the adhesive layer 25 and the substrate film 23. The electromagnetic shielding film 10 is overlapped with the flexible printed wiring board 20. The thermosetting adhesive layer 16 of the electromagnetic shielding film 10 is adhered to the surface of the insulating film 26 of the flexible printed wiring board 20, and the thermosetting adhesive layer 16 is cured.

Adhering and curing the thermosetting adhesive layer 16 is performed by heat pressing using a press machine (not illustrated in drawings). For example, the flexible printed wiring board 20 is adhered to the electromagnetic shielding film 10 by curing the thermosetting adhesive layer 16 by pressing for 10 minutes to 120 minutes at 130° C. to 200° C. under 50 MPa to 100 MPa.

(Step (e))

As illustrated in FIG. 4, the peeling film 18 is peeled from the electromagnetic shielding film 10.

This step may be performed as necessary, and the method for forming the flexible printed wiring board with the electromagnetic shielding film according to another aspect of the present invention may not include this step.

(Operation and Effect)

The method for forming the flexible printed wiring board with the electromagnetic shielding film according to another embodiment of the present invention can form the flexible printed wiring board with the electromagnetic shielding film according to another embodiment of the present invention which can achieve the above-described advantageous effect easily and with proper yield since the electromagnetic shielding film according to one embodiment of the present invention is used.

<Electronic Device>

Figure 5:
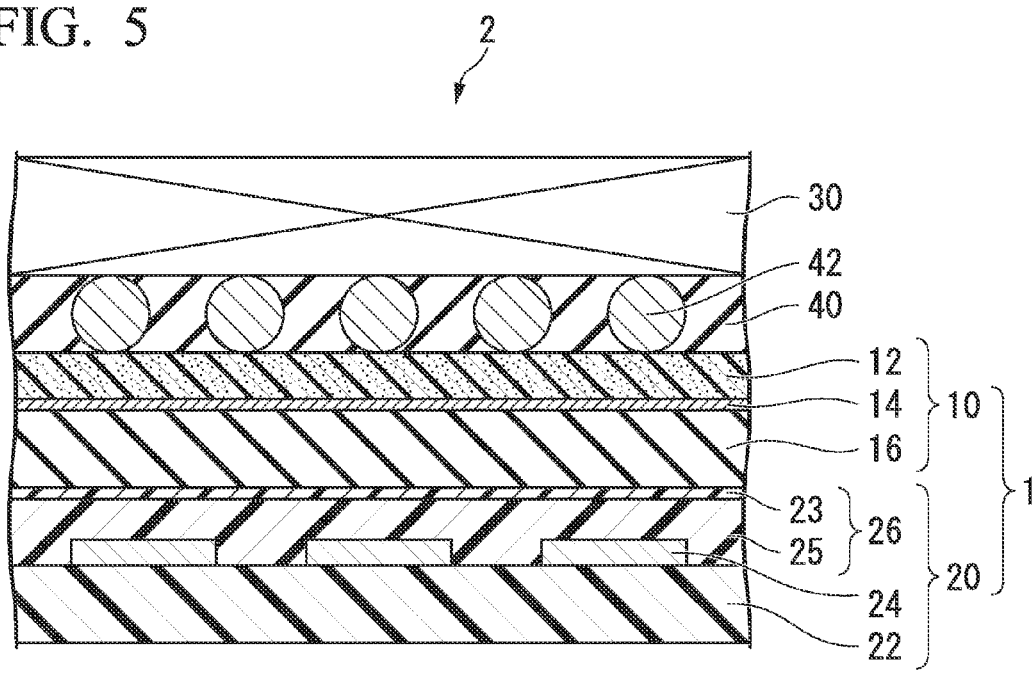
FIG. 5 is a cross-sectional view illustrating one aspect of the electronic device of still another embodiment of the present invention.

FIG. 5 is a cross-sectional view illustrating one aspect of the electronic device of still another embodiment of the present invention.

An electronic device 2 includes a housing 30 at least a portion of which has conductivity, a flexible printed wiring board with the electromagnetic shielding film 1 in which the peeling film 18 is peeled, an anisotropic conductive adhesive sheet 40. The housing 30 is adhered to the flexible printed wiring board with the electromagnetic shielding film 1 by the anisotropic conductive adhesive sheet 40. In other words, the anisotropic conductive adhesive sheet 40 is positioned between the housing 30 and the flexible printed wiring board with the electromagnetic shielding film 1. Additionally, the anisotropic conductive adhesive sheet 40 electrically connects the housing 30 and the conductive supporting substrate 12. The anisotropic conductive adhesive sheet 40 has conductivity in a thickness direction.

The electronic device 2 generally includes devices such as a display device, a communication device, and a control device, wirings, connectors and the like, which are not illustrated in drawings.

<Housing>

The housing 30 is a cover, a chassis, or the like which configures the electronic device 2. The housing 30 has a portion which is electrically connected to the conductive supporting substrate 12 and has a conductivity so as to functions as ground. As the housing 30, a housing made of a metal, a housing made of a resin base on which a metal is plated, a housing provided with a conductor for ground, and the like are given.

<Anisotropic Conductive Adhesive Sheet>

The anisotropic conductive adhesive sheet 40 has conductivity in the thickness direction but to only a small degree or does not have conductivity in a plane direction. The anisotropic conductive adhesive sheet 40 is a sheet with an adhesive property.

As the anisotropic conductive adhesive sheet 40, as illustrated in FIG. 5, a matrix made of an adhesive in which a conductive particle 42 is dispersed is given, for example.

As the adhesive, an epoxy resin, polyester, polyimide, polyamide imide, polyamide, a phenol resin, polyurethane, an acrylic resin, a melamine resin, polystyrene, polyolefin, and the like are given. The epoxy resin may include a rubber component (carboxylated nitrile butadiene rubber or the like) for imparting flexibility and a tackifier.

The anisotropic conductive adhesive sheet 40 can be adhesive at first and then have heat resistance by crosslinking by including a crosslinking component and a curing component.

Further, in order to improve the strength and the punching property of the anisotropic conductive adhesive sheet 40, a cellulose resin or a microfibril such as a glass fiber can be added to the anisotropic conductive adhesive sheet 40 within a range where the adhesion and conductivity are not hindered.

As the conductive particle 42, a metal particle such as silver, platinum, gold, copper, nickel, palladium, aluminum, and solder, a baked carbon particle plated with a metal and the like are given. In view of conductivity, a particle of a precious metal such as silver, gold, and platinum, a particle of a non-precious metal such as copper and nickel which is plated with a precious metal such as silver and gold, a baked carbon particle plated with a precious metal such as silver and gold, and the like are preferable. Since the baked carbon particle plated with the precious metal such as silver and gold has a high sphericity, the conductive supporting substrate 12 is not broken, and stable conductivity is obtained even if a contacting pressure is low. Therefore, the baked carbon particle plated with the precious metal such as silver and gold is more preferable.

The sphericity of the conductive particle 42 is 0.8 or more, preferably 0.9 or more, more preferably 0.95 or more. Higher the sphericity of the conductive particle 42 is, the more stable the conductivity is without breaking the thin conductive layer even if the contacting pressure is low.

In view of the electrical connection between the conductive supporting substrate 12 and the housing 30, an average particle diameter of the conductive particle 42 is preferably 0.8 to 1.4 times of the thickness of the anisotropic conductive adhesive sheet 40 after attaching the housing 30 and the flexible printed wiring board with the electromagnetic shielding film 1, more preferably 0.9 to 1.2 times of the thickness of the anisotropic conductive adhesive sheet 40, further preferably almost the same as the thickness of the anisotropic conductive adhesive sheet 40. The average particle diameter of the conductive particle 42 is calculated as follows. A hundred conductive particles are selected randomly from an image of a microscope of the conductive particles. The diameter of each of the conductive particles is measured, and the measured diameters are averaged.

The content of the conductive particle 42 with respect to 100 vol % of the anisotropic conductive adhesive sheet 40 is preferably 0.5 vol % to 20 vol %, more preferably 1 vol % to 10 vol %. When the content of the conductive particle 42 is 0.5 vol % or more, the conductivity in the thickness direction can be sufficiently secured. When the content of the conductive particle 42 is 20 vol % or less, the conductivity in the plane direction can be suppressed, and a price of the electronic device 2 can be reduced due to a suppression of the usage of the conductive particle 42.

The thickness of the anisotropic conductive adhesive sheet 40 is preferably 5 μm to 40 μm, more preferably 10 μm to 30 μm. When the thickness of the anisotropic conductive adhesive sheet 40 is 5 μm or more, a sufficient adhesive strength with respect to the housing 30 can be obtained. When the thickness of the anisotropic conductive adhesive sheet 40 is 40 μm or less, the electronic device 2 can be downsized and the usage of the conductive particle 42 can be reduced. The thickness of the anisotropic conductive adhesive sheet 40 is measured by a contact-type dial gauge.

(Operation and Effect)

The electronic device 2 described above is provided with the flexible printed wiring board with the electromagnetic shielding film 1 in which the ground of the electromagnetic shielding film 10 is enhanced since the housing, at least one portion of which has conductivity, is adhered to the flexible printed wiring board with the electromagnetic shielding film 1 in which the peeling film 18 is peeled by the anisotropic conductive adhesive sheet 40 and the housing 30 is electrically connected to the conductive supporting substrate 12.

<Method for Forming Electronic Device>

A method for forming an electronic device according to still another embodiment of the present invention includes the following step (f).

(f) attaching a housing at least a portion of which has conductivity and a flexible printed wiring board with the electromagnetic shielding film obtained by the method of forming the flexible printed wiring board with the electromagnetic shielding film according to another embodiment of the present invention by an anisotropic conductive adhesive sheet having conductivity in a thickness direction and electrically connecting the housing and the conductive supporting substrate.

(Step (f))

Figure 6:
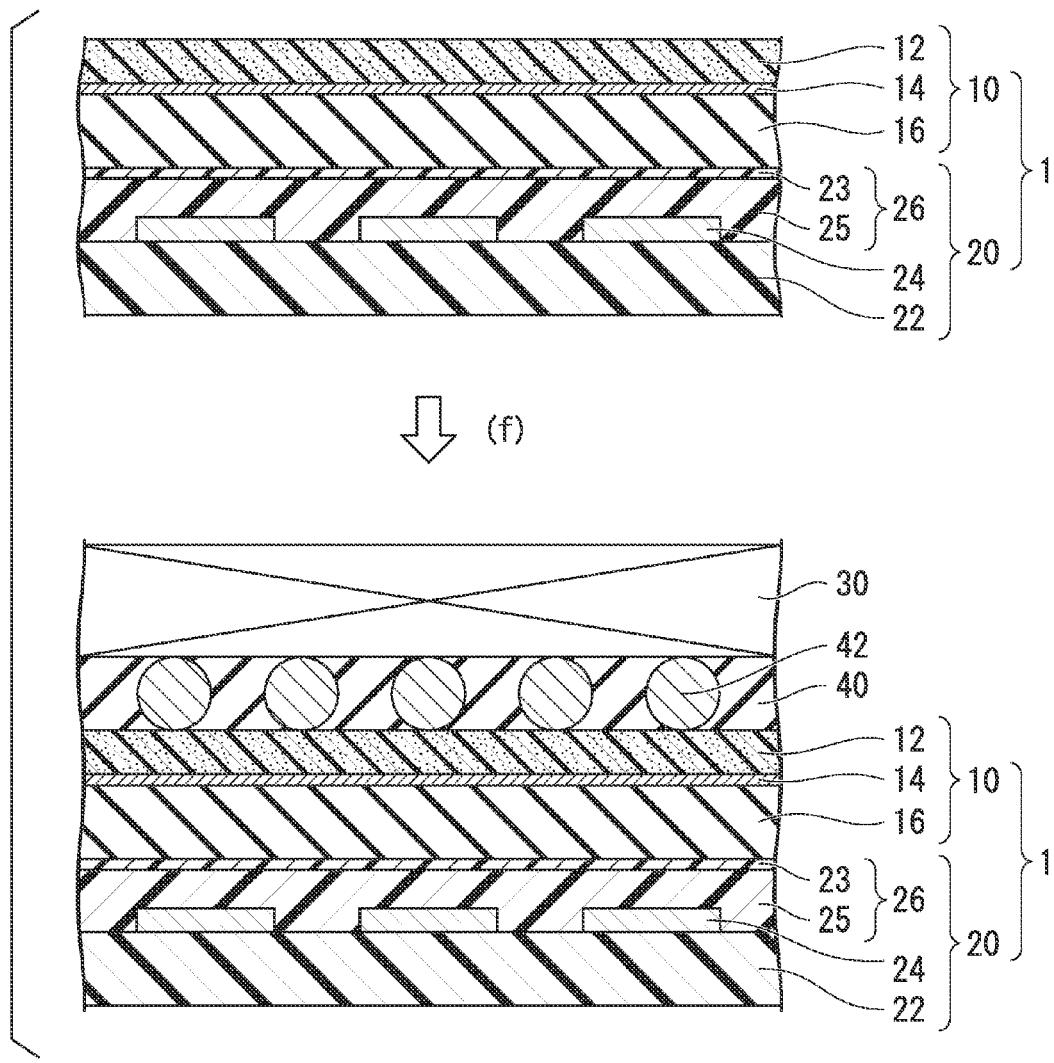
FIG. 6 is a cross-sectional view illustrating the electronic device in a step involved in a method of forming the electronic device of still another embodiment of the present invention.

As illustrated in FIG. 6, the anisotropic conductive adhesive sheet 40 and the flexible printed wiring board with the electromagnetic shielding film 1 are disposed on a surface of the housing 30, and the housing 30 and the flexible printed wiring board with the electromagnetic shielding film 1 are attached to each other by the anisotropic conductive adhesive sheet 40 at a room temperature under 1 MPa to 5 MPa to electrically connect the housing 30 and the conductive supporting substrate 12. By doing this, the electronic device 2 is obtained.

(Operation and Effect)

According to the method of forming the electronic device according to still another embodiment of the present invention, the electronic device which can achieve the above-described advantageous effect since the housing 30 at least a portion of which has conductivity and the flexible printed wiring board with the electromagnetic shielding film 1 in which the peeling film 18 is peeled are attached to each other by the anisotropic conductive adhesive sheet 40 and the housing 30 and the conductive supporting substrate 12 are electrically connected to each other.

The electromagnetic shielding film according to one embodiment of the present invention is useful as an electromagnetic shielding member of the flexible printed wiring board for an electronic device such as a smartphone, a mobile phone, an optical module, a digital camera, a game machine, a notebook computer, a medical equipment, and the like.

The preferable embodiments of the present invention have been explained above, however, the present invention is not limited thereto. Addition, omission, replacement and other change of components are allowable within the scope which does not deviate from the embodiments. The present invention is not limited to the explanation described above and is limited to the scope of the claims attached hereto.

EXAMPLES

Examples are described below. However, the present invention is not limited to the examples.

Example 1

Formation of Electromagnetic Shielding Film

Figure 7:
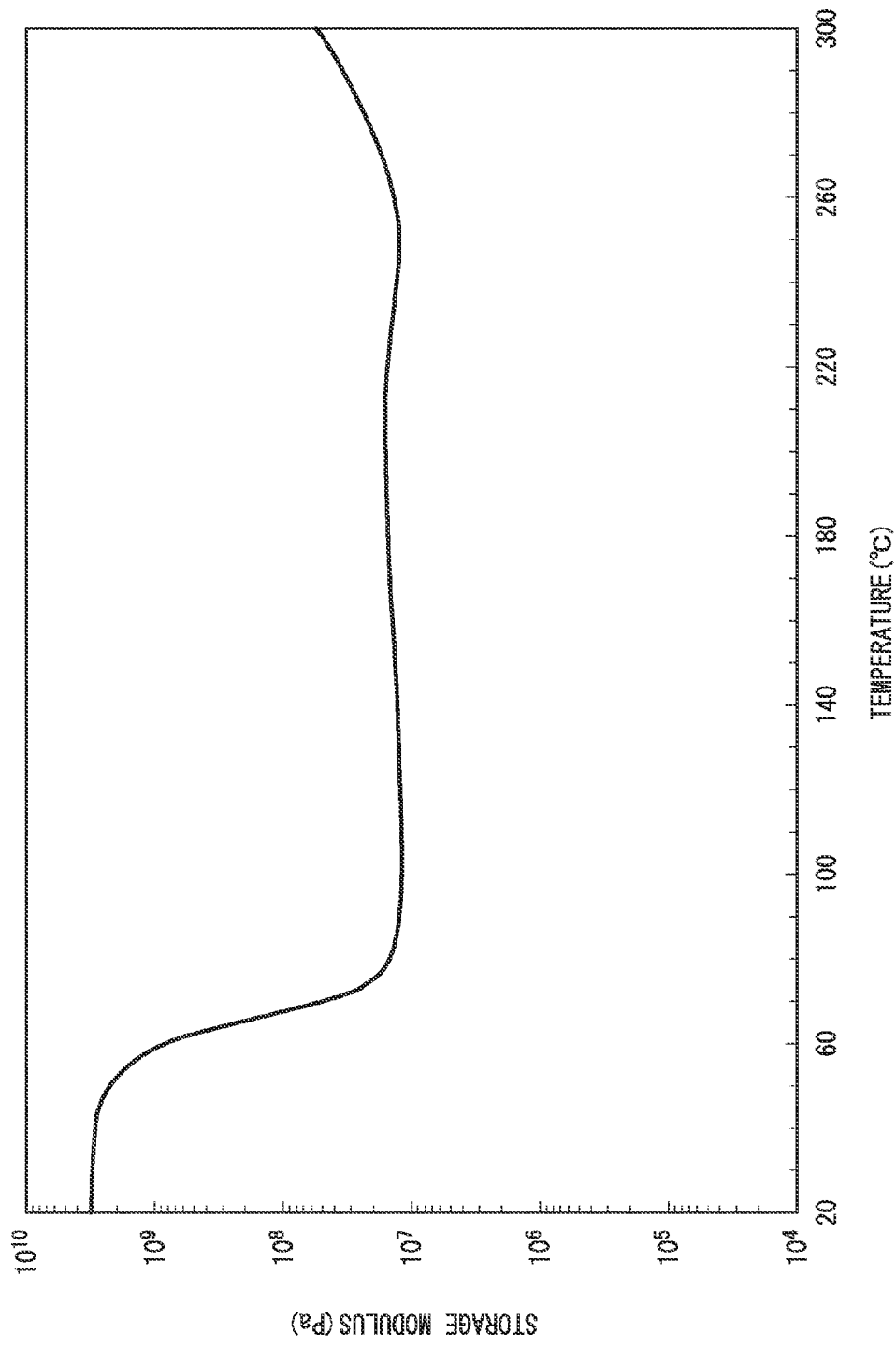
FIG. 7 is a graph showing measurement results of storage modulus of a conductive supporting substrate of Example 1.

Step (a):

A thermosetting resin composition which includes 80 vol % of an epoxy resin and 20 vol % of a carbon nanotube (average fiber length: 2.0 μm, average fiber diameter: 0.08

μm) with respect to the total volume of the thermosetting resin was applied on a surface of a polyester film (the peeling film 18) with a thickness of 37 μm the surface of which was treated to have a mold release property, stood for 0.5 hours at 140° C. in order to cure the epoxy resin. As a result, a conductive supporting substrate 12 with a thickness of 5 μm and a storage modulus at 180° C. of from $5 \times 10^6$ which was made of the cured material of the epoxy resin including the carbon nanotube and had conductivity in the thickness direction and the plane direction was obtained. The storage modulus was measured by using a dynamic viscoelasticity measurement device (RSAII manufactured by Rheometric Scientific, Inc.). The measurement result of the storage modulus is shown in FIG. 7.

Step (b):

Copper is physically deposited on a surface of the conductive supporting substrate 12 by an EB vapor deposition method, and a vapor deposition film (the metal thin film layer 14) with a thickness of 0.04 μm and a surface electrical resistance of 100Ω was formed.

Step (c):

A thermosetting adhesive composition made of a nitrile rubber denatured epoxy resin was applied on the metal thin film 14 so that a thickness of the dried thermosetting adhesive composition was 12 μm. By doing this, a thermosetting adhesive layer 16 was formed. As a result, the electromagnetic shielding film 10 was obtained.

<Formation of Flexible Printed Wiring Board>

A insulating adhesive composition made of a nitrile rubber denatured epoxy resin was applied on a surface of a polyimide film (a substrate film) with a thickness of 10 μm so that a thickness of the dried insulating adhesive composition was 20 μm. By doing this, an adhesive layer was formed. As a result, the insulating film 26 was obtained.

A main body of a printed wiring board in which a printed circuit 24 was formed on a polyimide film (a base film 22) with a thickness of 12 μm was prepared. The insulating film 26 was attached to the main body of a printed wiring board to obtain the flexible printed wiring board 20.

<Forming Flexible Printed Wiring Board with Electromagnetic Shielding Film>

Step (d):

The electromagnetic shielding film 10 was overlapped with the flexible printed wiring board 20, the thermosetting adhesive layer 16 was adhered to the surface of the insulating film 26 by heat pressing to cure the thermosetting adhesive layer 16. As a result, the flexible printed wiring board with the electromagnetic shielding film 1 was obtained.

Step (e):

The peeling film 18 was peeled from the electromagnetic shielding film 10.

<Formation of Electronic Device>

A commercially available anisotropic conductive adhesive sheet 40 and the flexible printed wiring board with the electromagnetic shielding film 1 were positioned on a surface of a housing 30 made of a metal. The housing 30 was attached to the flexible printed wiring board with the electromagnetic shielding film 1 by the anisotropic conductive adhesive sheet 40 to electrically connect the housing 30 and the conductive supporting substrate 12. As a result, the electronic device 2 was obtained.

Reference Example 1

Formation of Electromagnetic Shielding Film

Figure 8:
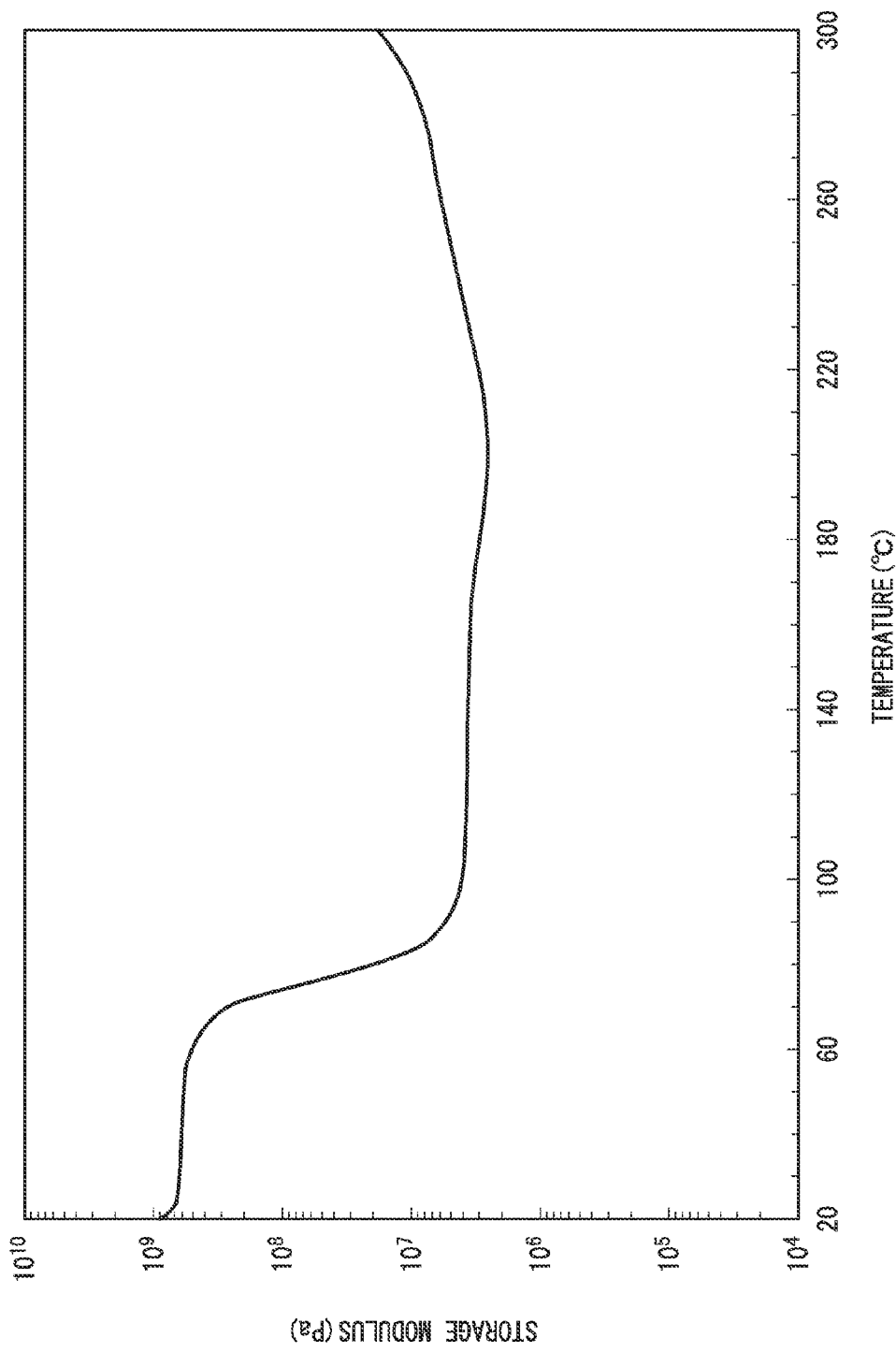
FIG. 8 is a graph showing measurement results of storage modulus of a conductive supporting substrate of Reference Example 1.
Figure 9:
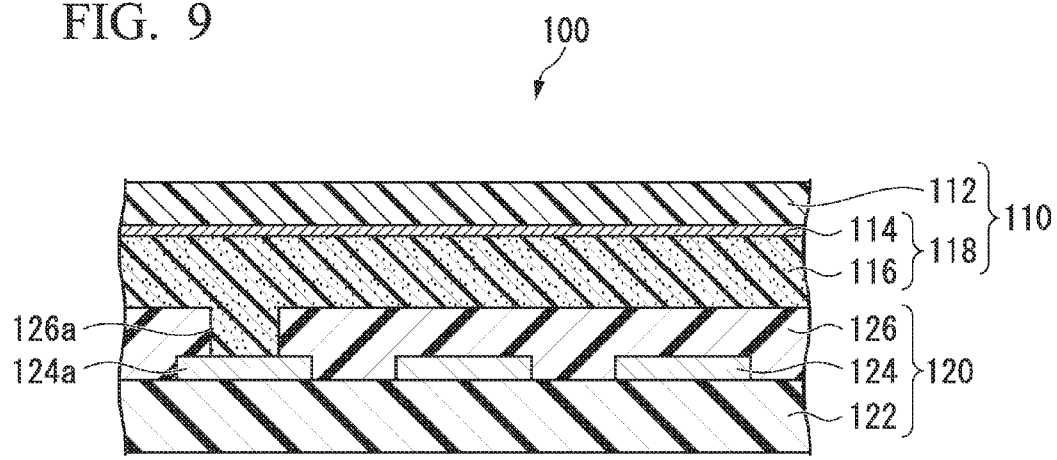
FIG. 9 is a cross sectional view illustrating an example of the flexible printed wiring board with the electromagnetic shielding film of the related art.
Figure 10:
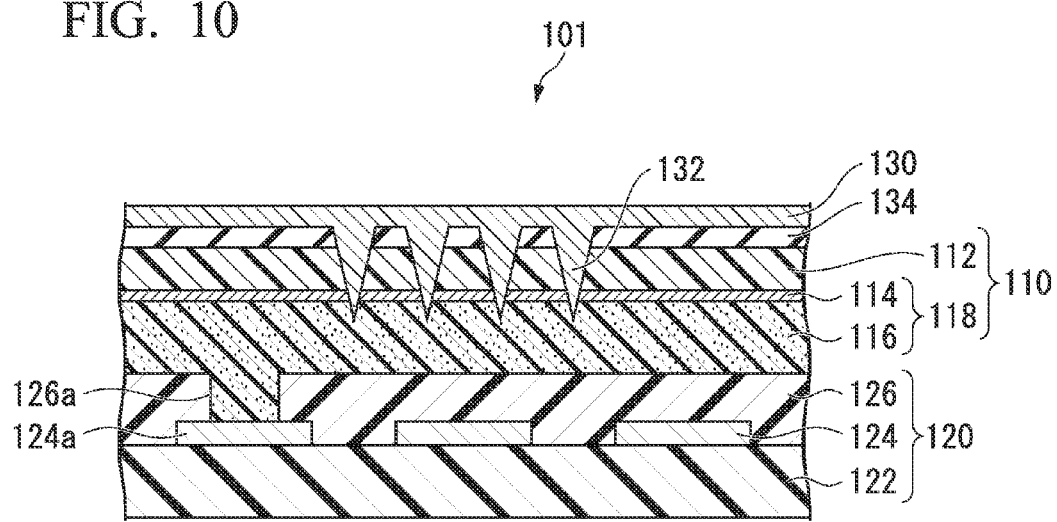
FIG. 10 is a cross sectional view illustrating other example of the flexible printed wiring board with the electromagnetic shielding film of the related art.
Figure 11:
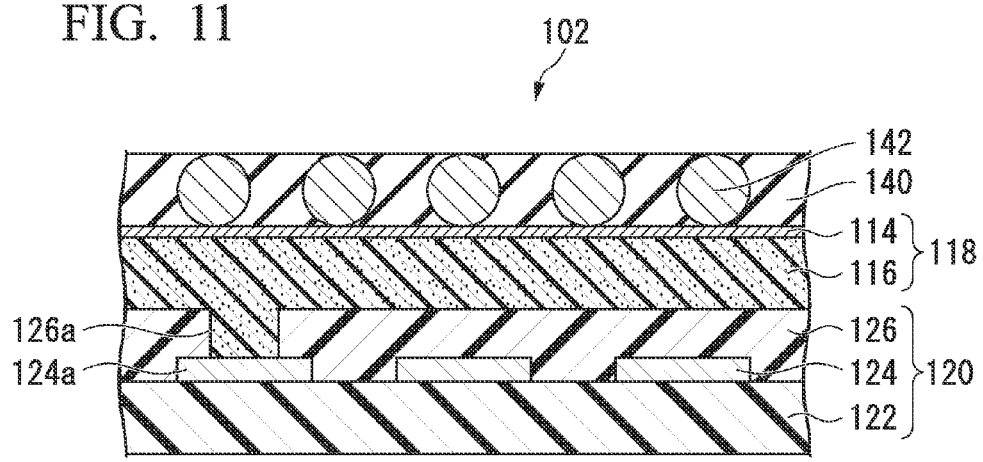
FIG. 11 is a cross sectional view illustrating an example of the flexible printed wiring board which is electromagnetically shielded of the related art.
Figure 12:
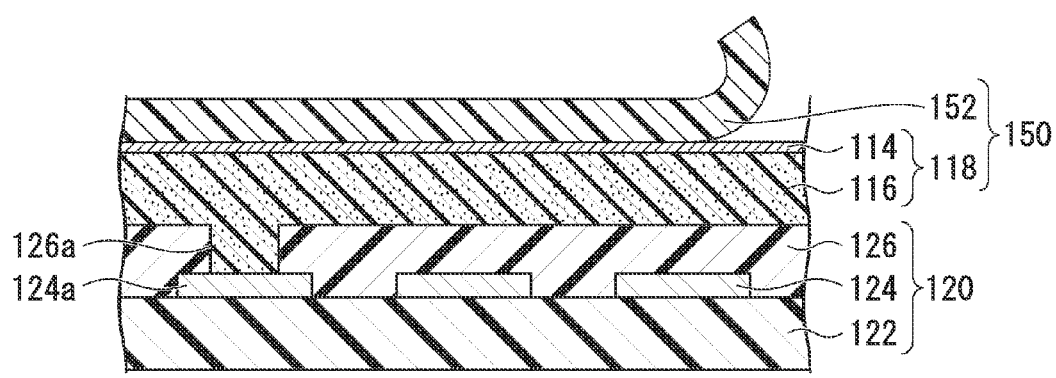
FIG. 12 is a cross sectional view illustrating the flexible printed wiring board which is electromagnetically shielded in a step of forming the flexible printed wiring board of the related art.

Step (a):

A thermosetting resin composition which includes 50 vol % of an epoxy resin and 50 vol % of a silver particle (average particle diameter: 0.7 μm) with respect to the total volume of the thermosetting resin composition was applied on a surface of a polyester film (the peeling film 18) with a thickness of 37 μm the surface of which was treated to have a mold release property, stood for 0.5 hours at 140° C. in order to cure the epoxy resin. As a result, a conductive supporting substrate 12 with a thickness of 5 μm and $4 \times 10^6$ Pa of a storage modulus at 180° C. which was made of the cured material of the epoxy resin including the silver particle and had conductivity in the thickness direction and the plane direction was obtained. The measurement result of the storage modulus is shown in FIG. 8.

Step (b):

Copper is physically deposited on the surface of the conductive supporting substrate 12 by the EB vapor deposition method, and a vapor deposition film (the metal thin film layer 14) with a thickness of 0.04 μm and a surface electrical resistance of 100Ω was formed.

Step (c):

A thermosetting adhesive composition made of a nitrile rubber denatured epoxy resin was applied on the metal thin film 14 so that a thickness of the dried thermosetting adhesive composition was 20 μm. By doing this, a thermosetting adhesive layer 16 was formed. As a result, the electromagnetic shielding film 10 was obtained.

<Formation of Flexible Printed Wiring Board with Electromagnetic Shielding Film>

Step (d):

The electromagnetic shielding film 10 was overlapped with the flexible printed wiring board 20 which was obtained in the same manner as Example 1, the thermosetting adhesive layer 16 was adhered to the surface of the insulating film 26 by heat pressing to cure the thermosetting adhesive layer 16. As a result, the flexible printed wiring board with the electromagnetic shielding film 1 was obtained.

Step (e):

The peeling film 18 was peeled from the electromagnetic shielding film 10. The conductive supporting substrate 12 was broken, and a part of the conductive supporting substrate 12 as well as the peeling film 18 was peeled.

What is claimed is:

1. An electromagnetic shielding film comprising:
   a conductive supporting substrate which includes a cured material of a thermosetting resin including a conductive filler;
   a metal thin film layer which covers one surface of the conductive supporting substrate;
   a thermosetting adhesive layer which covers a surface of the metal thin film layer; and
   a peeling substrate which covers the other surface of the conductive supporting substrate,
   wherein a storage modulus of the conductive supporting substrate at 180° C. is from $8 \times 10^6$ to $1 \times 10^8$ Pa.

2. The electromagnetic shielding film according to claim 1, wherein
   the conductive filler is a fibrous conductive filler.

3. A flexible printed wiring board with the electromagnetic shielding film comprising:

a flexible printed wiring board which includes a base film including polyimide and a printed circuit positioned on at least one surface of the base film; and the electromagnetic shielding film according to claim 1 in which the thermosetting adhesive layer is adhered to at least one surface of the flexible printed wiring board and the thermosetting adhesive layer is cured.

4. A flexible printed wiring board with the electromagnetic shielding film comprising:

a flexible printed wiring board which includes a base film including polyimide and a printed circuit positioned on at least one surface of the base film; and an electromagnetic shielding film, wherein the electromagnetic shielding film comprises:

a conductive supporting substrate which includes a cured material of a thermosetting resin including a conductive filler;

a metal thin film layer which covers one surface of the conductive supporting substrate; and a thermosetting adhesive layer which covers a surface of the metal thin film layer, wherein the thermosetting adhesive layer is adhered to at least one surface of the flexible printed wiring board, the thermosetting adhesive layer is cured, and a storage modulus of the conductive supporting substrate at 180° C. is from $8\times10^6$ to $1\times10^8$ Pa.

5. An electronic device comprising:

a housing at least a portion of which has conductivity;

the flexible printed wiring board with the electromagnetic shielding film according to claim 4;

an anisotropic conductive adhesive sheet which is positioned between the housing and the flexible printed wiring board with the electromagnetic shielding film, electrically connects the housing and the conductive supporting substrate, and has conductivity in a thickness direction.

6. A method of forming an electromagnetic shielding film, the method comprising:

forming a conductive supporting substrate made of a cured material of a thermosetting resin which includes a conductive filler by applying and curing a thermosetting resin composition which includes the conductive filler on one surface of a peeling substrate;

forming a metal thin film layer on a surface of the conductive supporting substrate; and forming a thermosetting adhesive layer on a surface of the metal thin film layer, wherein a storage modulus of the conductive supporting substrate at 180° C. is from $8\times10^6$ to $1\times10^8$ Pa.

7. A method of forming a flexible printed wiring board with an electromagnetic shielding film, the method comprising:

adhering and curing the thermosetting adhesive layer of the electromagnetic shielding film obtained by the method for forming the electromagnetic shielding film according to claim 6 on at least one surface of a flexible printed wiring board in which a printed circuit is provided on at least one surface of a base film including polyimide.

8. The method of forming a flexible printed wiring board with an electromagnetic shielding film according to claim 7, the method further comprising:

peeling the peeling substrate.

9. A method for forming an electronic device comprising:

attaching a housing at least a portion of which has conductivity and the flexible printed wiring board with the electromagnetic shielding film obtained by the method of forming the flexible printed wiring board with the electromagnetic shielding film according to claim 8 by an anisotropic conductive adhesive sheet having conductivity in a thickness direction and electrically connecting the housing and the conductive supporting substrate.

\* \* \* \* \*